United States Patent
Chen et al.

(10) Patent No.: US 7,576,992 B2
(45) Date of Patent: Aug. 18, 2009

(54) FLEXIBLE PRINTED CIRCUIT AND DISPLAY DEVICE UTILIZING THE SAME

(75) Inventors: Chien-Liang Chen, Yunlin County (TW); Chun-Yu Lee, Tainan County (TW); Hui-Chang Chen, Kaohsiung (TW)

(73) Assignee: Au Optronics Corp., Hsinchu (TW)

( * ) Notice: Subject to any disclaimer, the term of this patent is extended or adjusted under 35 U.S.C. 154(b) by 611 days.

(21) Appl. No.: 11/424,273

(22) Filed: Jun. 15, 2006

(65) Prior Publication Data
US 2007/0144771 A1 Jun. 28, 2007

(30) Foreign Application Priority Data
Dec. 23, 2005 (TW) ............... 94146099 A

(51) Int. Cl.
*H05K 1/00* (2006.01)
(52) U.S. Cl. ...................... 361/749; 174/254
(58) Field of Classification Search ............... 361/749, 361/750, 751, 795, 803; 174/254, 259, 260; 257/688, 778, 779
See application file for complete search history.

(56) References Cited
U.S. PATENT DOCUMENTS
6,201,689 B1 * 3/2001 Miyasyo ............ 361/679.54
7,067,334 B2 * 6/2006 Cho ..................... 438/15
7,355,126 B2 * 4/2008 Nishikawa et al. ...... 174/260
2006/0065437 A1 * 3/2006 Yumoto et al. .......... 174/260
2006/0113109 A1 * 6/2006 Koga .................. 174/261

FOREIGN PATENT DOCUMENTS
TW 200505300 7/1992
TW 449897 8/2001
TW 567367 6/2006

* cited by examiner

*Primary Examiner*—Dean A. Reichard
*Assistant Examiner*—Yuriy Semenenko
(74) *Attorney, Agent, or Firm*—Thomas, Kayden, Horstemeyer & Risley

(57) ABSTRACT

A flexible printed circuit comprising a substrate, a plurality of function lines, and a plurality of first dummy lines. The substrate comprises at least two periphery areas and an intermediate area. Each periphery area comprises a first layout region, a second layout region and a first rough region disposed between the first and second layout regions. The intermediate area is disposed between the periphery areas. The function lines are disposed on the substrate and within the intermediate area. The first dummy lines are disposed on the substrate and within the first or second layout area.

22 Claims, 5 Drawing Sheets

FLEXIBLE PRINTED CIRCUIT AND DISPLAY DEVICE UTILIZING THE SAME

This application claims the benefit of Taiwan Application Serial No. 94146099, filed Dec. 23, 2005, the subject matter of which is incorporated herein by reference.

BACKGROUND OF THE INVENTION

1. Field of the Invention

The invention relates to a flexible printed circuit (FPC), and more particularly a FPC applied in a display device.

2. Description of the Related Art

FIG. 1a is a schematic diagram of a conventional FPC applied in a display device. FPCs 131~13n are coupled between a display panel 11 and a printed circuit board (PCB) 12 for transmitting signals therebetween. Display panel 11 and PCB 12 respectively comprise a plurality of connection lines (not shown) for connecting FPCs 131~13n. FPCs 131~13n respectively comprise metal lines L1~L4. One terminal of the metal lines L1~L4 is coupled to connection lines of display panel 11 and the other terminal of metal lines L1~L4 is coupled to connection lines of PCB 12.

FIG. 1b shows a cross section along line A-A of FIG. 1a. Since the connection methods applied among FPCs 131~13n, display panel 11, and PCB 12 are the same, a connection method applied among FPC 131, display panel 11, and PCB 12 is given as an example.

First, Anisotropic Conductive Film (ACF) 14 is disposed among display panel 11, PCB 12, and FPC 131. Next, ACF 14 is heated to increase adhesion capability and pressure is than exerted on display panel 11, PCB 12, and FPC 131 to electrically connect connection line L5 and metal line L1, and connection line L6 and metal line L1.

Metal line L1 and connection lines L5, L6 are generally constituted by copper, however, the adhesion capability between copper and ACF 14 is poor. Thus, display panel 11 and PCB 12 are not firmly connected to FPC 13.

To prevent the adhesion problem, the duration that pressure is exerted is increased to increase the adhesion capability between metal line L1 and connection line L5, and metal line L1 and connection line L6. When the pressure duration is increased, the manufacture timing of the display device increases.

BRIEF SUMMARY OF THE INVENTION

Flexible printed circuits are provided. An exemplary embodiment of a flexible printed circuit comprises a substrate, a plurality of function lines, and a plurality of first dummy lines. The substrate comprises at least two periphery areas and an intermediate area. Each periphery area comprises a first layout region, a second layout region and a first rough region disposed between the first and second layout regions. The intermediate area is disposed between the periphery areas. The function lines are disposed on the substrate and within the intermediate area. The first dummy lines are disposed on the substrate and within the first or second layout area.

Display devices are also provided. An exemplary embodiment of a display device comprises a display panel, a printed circuit board, and a flexible printed circuit. The flexible printed circuit electrically connects the display panel and the printed circuit board and comprises a substrate, a plurality of function lines, and a plurality of first dummy lines. The substrate comprises at least two periphery areas and an intermediate area. Each periphery area comprises a first layout region, a second layout region and a first rough region disposed between the first and second layout regions. The intermediate area is disposed between the periphery areas. The function lines are disposed on the substrate and within the intermediate area. The first dummy lines are disposed on the substrate and within the first or second layout area.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1b shows a cross section along line A-A of FIG. 1a;

FIG. 2b shows a cross section along line B-B of FIG. 2a; and

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
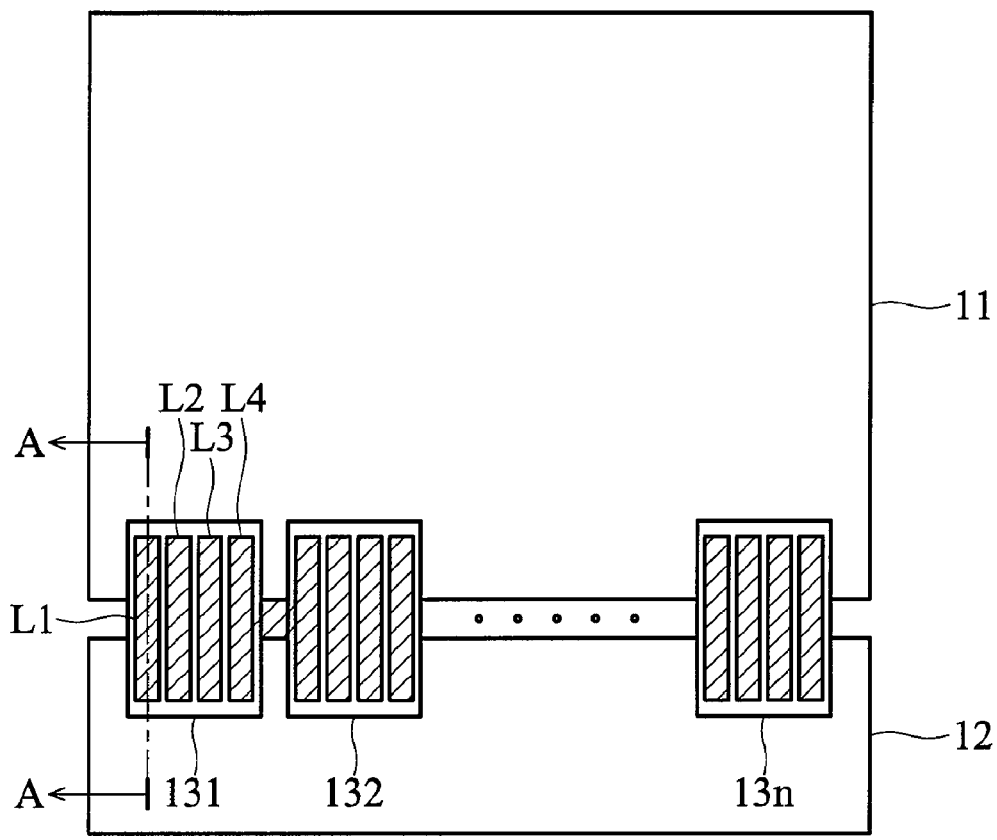
FIG. 1a is a schematic diagram of a conventional FPC applied in a display device.
Figure 1B:
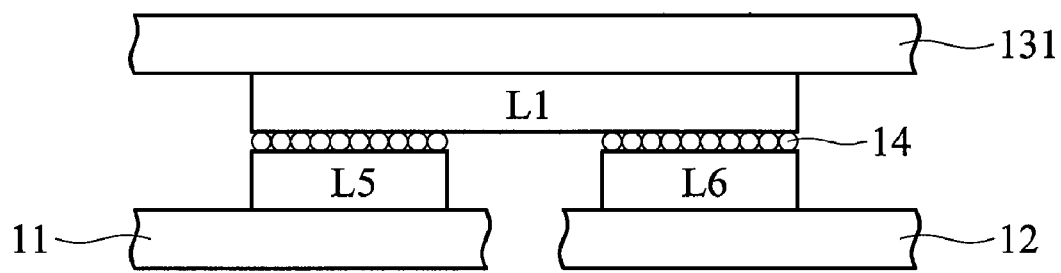
Figure 2A:
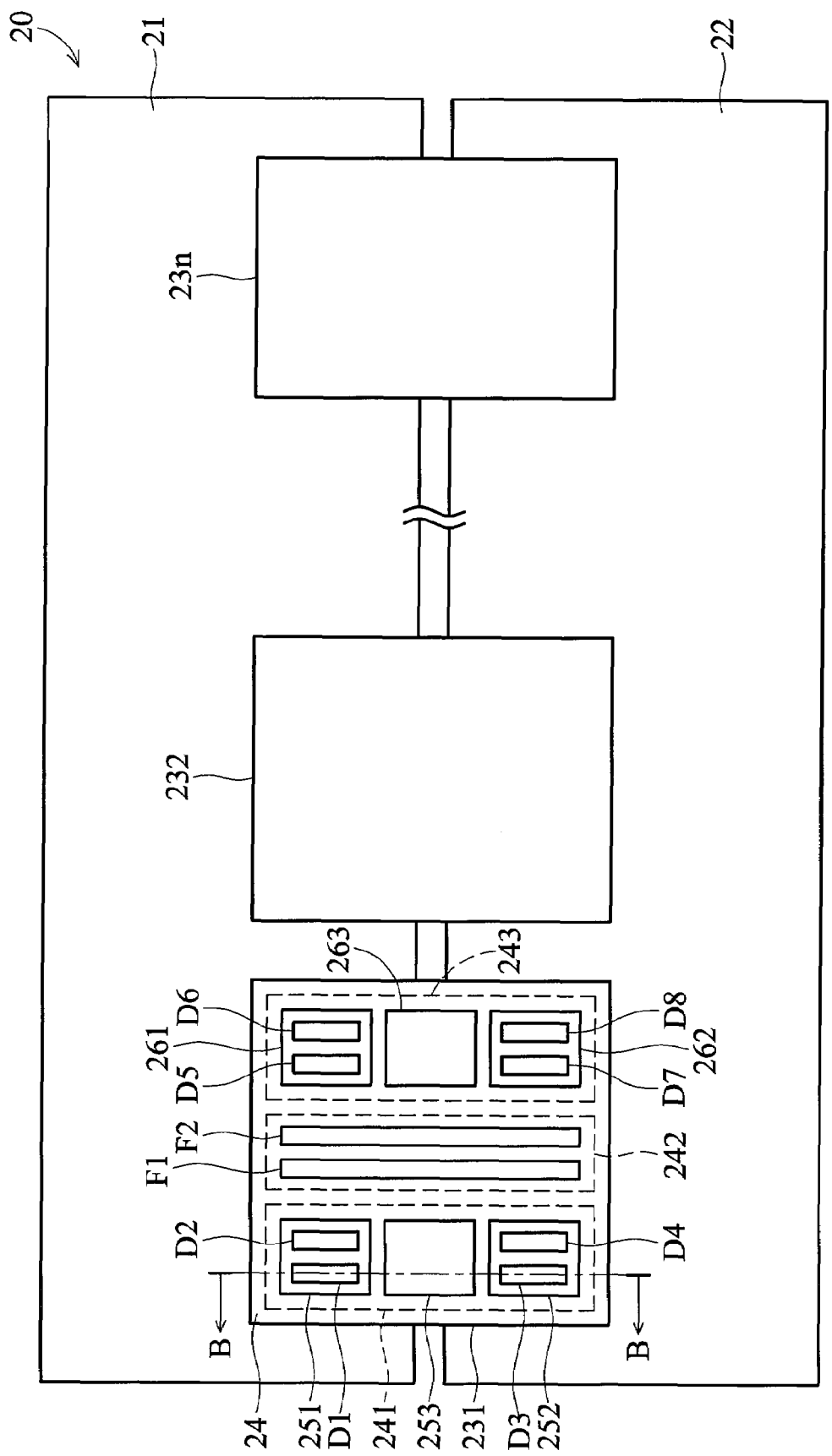
FIG. 2a is a schematic diagram of an exemplary embodiment of a FPC.

FIG. 2a is a schematic diagram of an exemplary embodiment of an FPC. A display device 20 comprises a display panel 21, a PCB 22, and FPCs 231~23n electrically connecting display panel 21 and PCB 22 for transmitting control signals from PCB 22 to display panel 21. Display panel 21 and PCB 22 respectively comprise connection lines (not shown) for connecting FPCs 231~23n. Since the structures of display panel 21 and PCB 22 are well known to those skilled in the art, thus, description thereof is omitted.

FPC 231 is given as an example. FPC 231 comprises a substrate 24, function lines F1, F2, and dummy lines D1~D8.

Substrate 24 comprises periphery areas 241, 243 and an intermediate area 242. Intermediate area 242 is disposed between periphery areas 241 and 243 and comprises function lines F1 and F2. Signals are transmitted between display panel 21 and PCB 22 through function lines F1 and F2.

Periphery area 241 comprises layout region 251 and 252, and a rough region 253. Rough region 253 is roughed for increasing an adhesion capability between rough region 253 and the ACF, and is disposed between layout regions 251 and 252. The width of rough region 253 is between 2 cm and 4 cm. In this embodiment, the width of rough region 253 is between 2.3 cm and 4 cm or between 2 cm and 2.3 cm.

Layout region 251 comprises dummy lines D1 and D2. Layout region 252 comprises dummy lines D3 and D4. Dummy lines D1~D4 cannot transmit signals. In this embodiment, the lengths of dummy lines D1 and D2 are equal to that of dummy lines D3 and D4. The number of dummy lines within layout region 251 is equal to that of the dummy lines within layout region 252, but the disclosure is not limited thereto.

Periphery area 243 comprises layout region 261 and 262, and a rough region 263. Rough region 263 is roughed and disposed between layout region 261 and 262. The width of rough region 263 is between 2 cm to 4 cm. In this embodiment, the width of rough region 263 is between 2.3 cm to 4 cm or between 2 cm to 2.3 cm.

Layout region 261 comprises dummy lines D5 and D6. Layout region 262 comprises dummy lines D7 and D8. Dummy lines D5~D8 cannot transmit signals. In this embodiment, the lengths of dummy lines D5 and D6 are equal to that of dummy lines D7 and D8. The number of dummy lines within layout region 261 is equal to that of dummy lines within layout region 262, but the disclosure is not limited thereto.

In some embodiments, dummy lines are disposed within layout regions 251 and 261 or within layout regions 252 and 262. Additionally, the lengths of dummy lines D1~D4 are shorter than that of dummy lines D5~D8. In this embodiment, the lengths of dummy lines D1~D4 are equal to that of dummy lines D5~D8

Figure 2B:
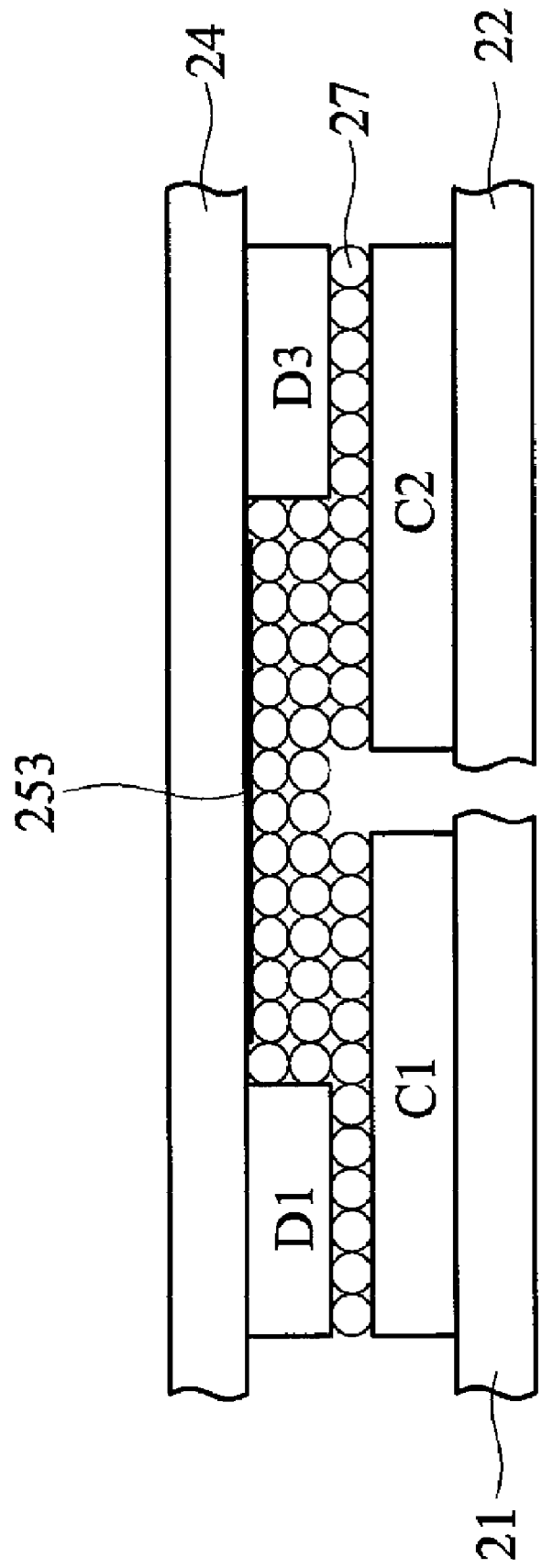

FIG. 2b shows a cross section along line B-B of FIG. 2a. ACF 27 is disposed among display panel 21, PCB 22, and FPC 231. When ACF 27 is heated, pressure is exerted on display panel 21, PCB 22, and FPC 231 such that dummy line D1 of FPC 231 is connected to connection line C1 of display panel 21 and dummy line D3 of FPC 231 is connected to connection line C2 of PCB 22. Since rough region 253 is roughed, an adhesion capability between ACF 27 and FPC 231 is increased for firmly connecting display panel 21, PCB 22, and FPC 231.

Figure 3:
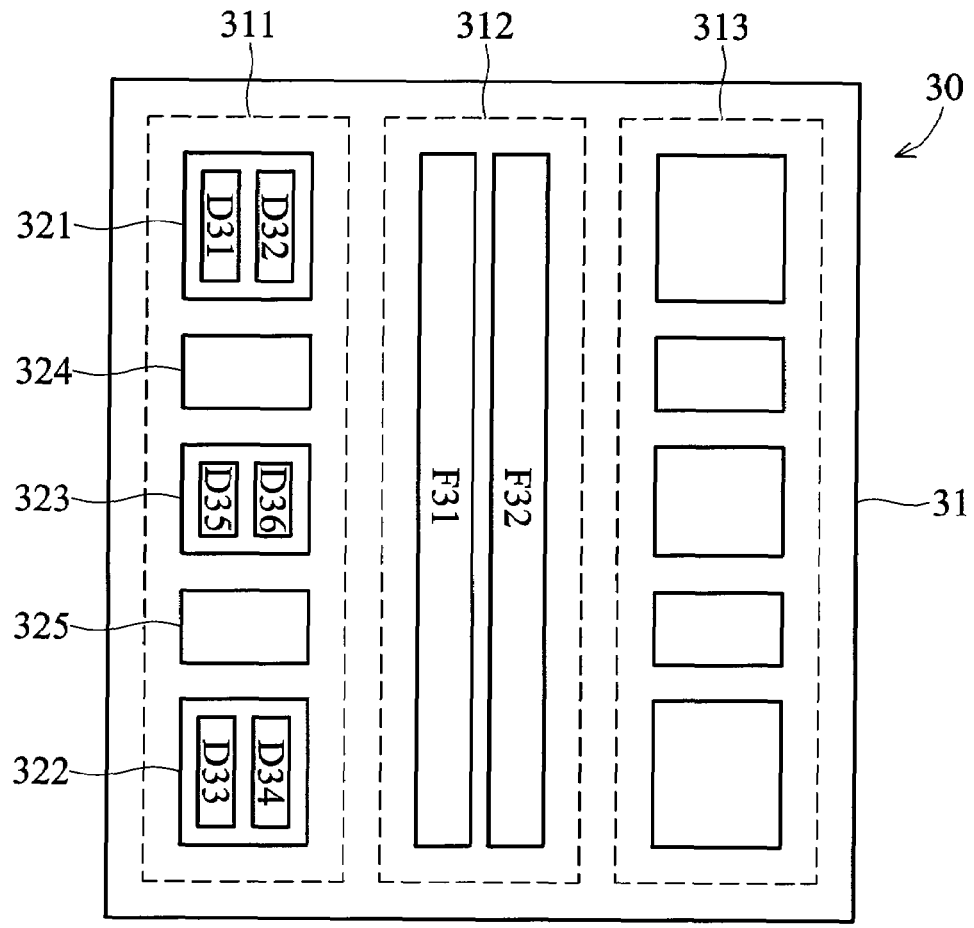
FIGS. 3~5 are schematic diagrams of another exemplary embodiment of the FPC.

FIG. 3 is a schematic diagram of another exemplary embodiment of the FPC. FPC 30 comprises a substrate 31 comprising periphery areas 311 and 313, and an intermediate area 312. Intermediate area 312 is disposed between periphery areas 311 and 313 and comprises function lines F31 and F32.

Since structures of periphery areas 311 and 313 are the same, periphery area 311 is given as an example. Periphery area 311 comprises layout regions 321~323 and rough regions 324 and 325. Rough region 324 is disposed between layout regions 321 and 323 and roughed. Rough region 325 is disposed between layout regions 323 and 322 and roughed.

Layout region 321 comprises dummy lines D31 and D32. Layout region 322 comprises dummy lines D33 and D34. Layout region 323 comprises dummy lines D35 and D36. The length, shape, and number of dummy lines D31~D34 are not limited. In this embodiment, the lengths of dummy lines D31~D34 are the same and shorter than the lengths of dummy lines D35 and D36.

Figure 4:
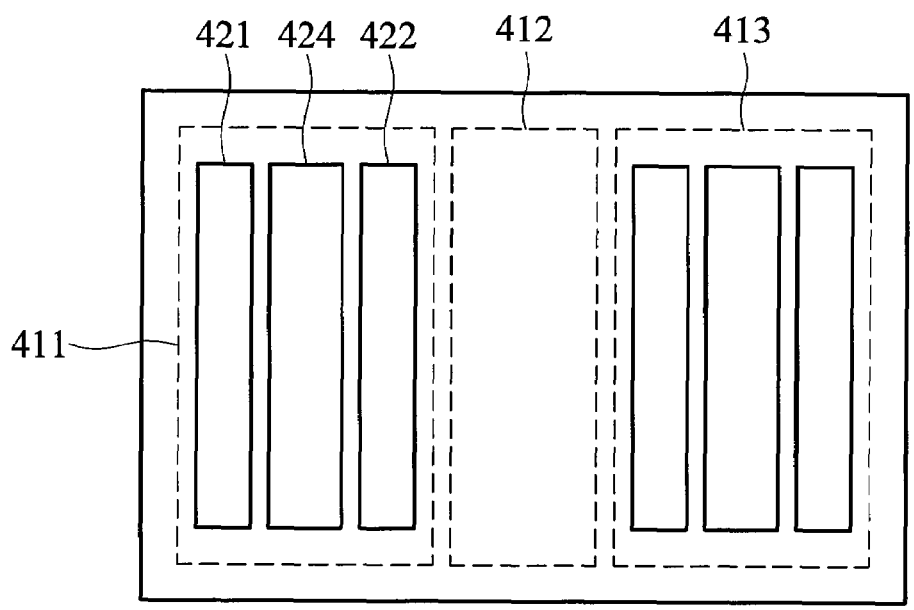

FIG. 4 is a schematic diagram of another exemplary embodiment of the FPC. FIG. 4 is similar to the FIG. 2 except that a layout region 421 is disposed on the left side of a rough region 424, a layout region 422 is disposed on the right side of a rough region 424, and an intermediate area 412 is disposed between periphery areas 411 and 413.

Figure 5:
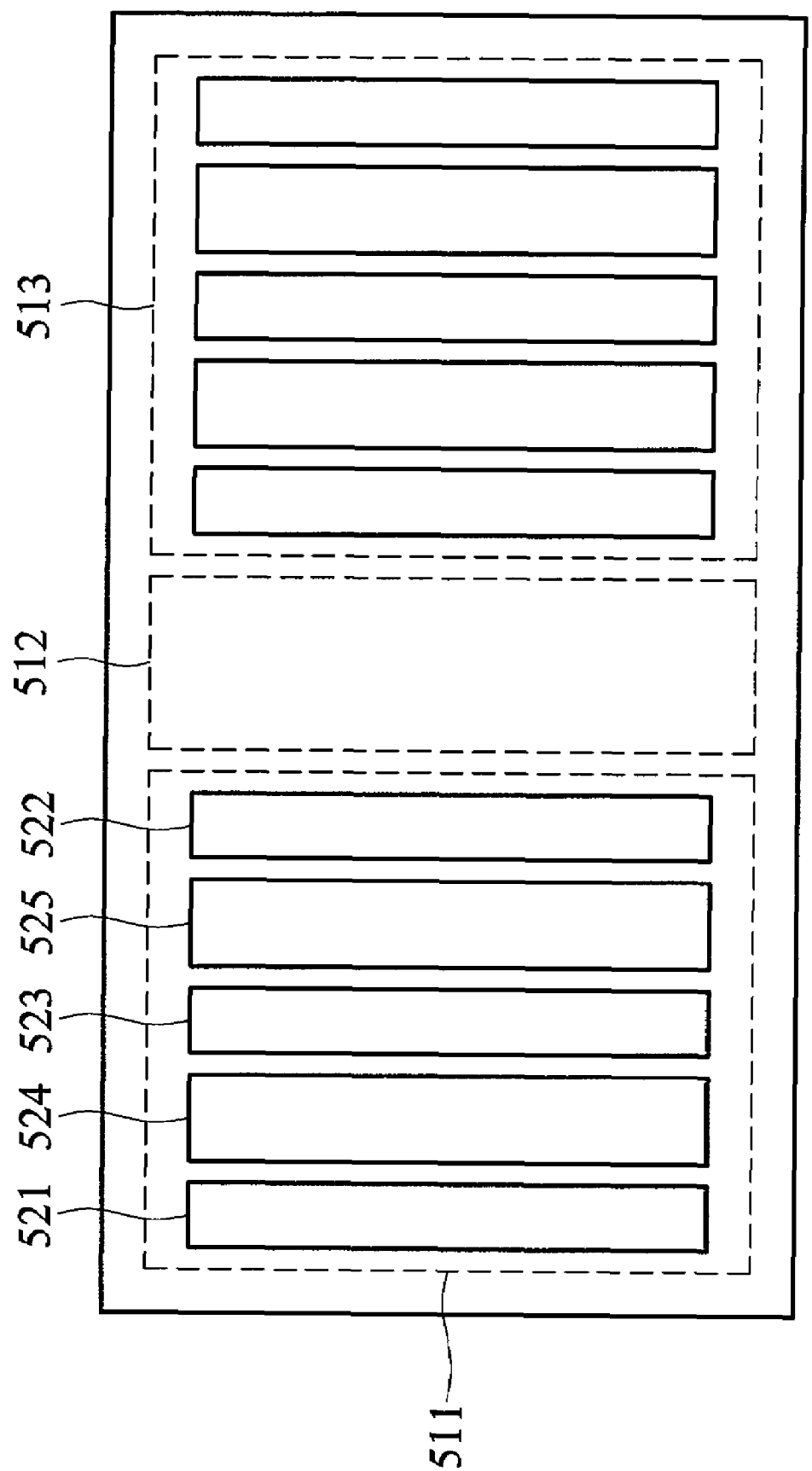

FIG. 5 is a schematic diagram of another exemplary embodiment of the FPC. The FIG. 5 is similar to the FIG. 3 except that a layout region 521 is disposed on the left side of a rough region 524, a layout region 522 is disposed on the right side of a rough region 524, a layout region 523 is disposed on the left side of a rough region 525, a layout region 522 is disposed on the right side of a rough region 524, and an intermediate area 512 is disposed between periphery areas 511 and 513.

As described, because the rough region is roughed, the adhesion capability between ACF and FPC is increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flexible printed circuit, comprising:
    a substrate comprising at least two periphery areas and an intermediate area between the periphery areas, each periphery area having a first layout region, a second layout region, and a first rough region between the first and second layout regions;
    a plurality of function lines disposed on the substrate and within the intermediate area; and
    a plurality of first dummy lines disposed on the substrate and within at least one of the first layout region and the second layout region.

2. The flexible printed circuit as claimed in claim 1, further comprising a plurality of second dummy lines disposed on the substrate, wherein the first dummy lines are disposed within the first layout region and the second dummy lines are disposed within the second layout region.

3. The flexible printed circuit as claimed in claim 2, wherein the length of the first dummy lines is substantially equal to that of the second dummy lines.

4. The flexible printed circuit as claimed in claim 2, wherein the length of the first dummy lines is substantially shorter than that of the second dummy lines.

5. The flexible printed circuit as claimed in claim 1, wherein the width of the first rough region is between about 2 cm and about 4 cm.

6. The flexible printed circuit as claimed in claim 1, wherein the width of the first rough region is between about 2.3 cm and about 4 cm.

7. The flexible printed circuit as claimed in claim 1, wherein the width of the first rough region is between about 2 cm and about 2.3 cm.

8. The flexible printed circuit as claimed in claim 1, wherein at least one of the function lines is adapted to transmit a signal.

9. The flexible printed circuit as claimed in claim 1, further comprising a plurality of third dummy lines disposed on the substrate, wherein each periphery area has a third layout region and a second rough region, the third layout region is between the first rough region and the second layout region, the second rough region is between the second and the third layout regions, and the third dummy lines are disposed within the third layout region.

10. The flexible printed circuit as claimed in claim 9, wherein the length of the first dummy lines is substantially equal to that of the third dummy lines.

11. The flexible printed circuit as claimed in claim 9, wherein the length of the third dummy lines is substantially shorter than that of the first dummy lines.

12. A display device, comprising:
    a display panel;
    a printed circuit board; and
    a flexible printed circuit, electrically connected to the display panel and the printed circuit board, comprising:
        a substrate comprising at least two periphery areas and an intermediate area between the periphery areas, each periphery area having a first layout region, a second layout region, and a first rough region between the first and second layout regions;
        a plurality of function lines disposed on the substrate and within the intermediate area; and a plurality of first dummy lines disposed on the substrate and within at least one of the first layout region and the second layout region.

13. The display device as claimed in claim 12, wherein the flexible printed circuit further comprises a plurality of second dummy lines disposed on the substrate and the first dummy lines are disposed within the first layout region and the second dummy lines are disposed within the second layout region.

14. The display device as claimed in claim 13, wherein the length of the first dummy lines is substantially equal to that of the second dummy lines.

15. The display device as claimed in claim 13, wherein the length of the first dummy lines is substantially shorter than that of the second dummy lines.

16. The display device as claimed in claim 12, wherein the width of the first rough region is between about 2 cm and about 4 cm.

17. The display device as claimed in claim 12, wherein the width of the first rough region is between about 2.3 cm and about 4 cm.

18. The display device as claimed in claim 12, wherein the width of the first rough region is between about 2 cm and about 2.3 cm.

19. The display device as claimed in claim 12, wherein at least one of the function lines transmits a signal between the display panel and the printed circuit board.

20. The display device as claimed in claim 12, wherein the flexible printed circuit further comprises a plurality of third dummy lines disposed on the substrate, wherein each periphery area has a third layout region and a second rough region, the third layout region is between the first rough region and the second layout region, the second rough region is between the second and the third layout regions, and the third dummy lines are disposed within the third layout region.

21. The display device as claimed in claim 20, wherein the length of the first dummy lines is substantially equal to that of the third dummy lines.

22. The display device as claimed in claim 20 wherein the length of the third dummy lines is substantially shorter than that of the first dummy lines.

* * * * *